(12) United States Patent
Hong et al.

(10) Patent No.: US 11,184,016 B2
(45) Date of Patent: Nov. 23, 2021

(54) MULTIPLE-MODULI RING-OSCILLATOR-BASED FREQUENCY DIVIDER

(71) Applicant: Brian Daffern Hong, Sierra Madre, CA (US)

(72) Inventors: Brian Daffern Hong, Sierra Madre, CA (US); Seyed Ali Hajimiri, Pasadena, CA (US)

(73) Assignee: Brian Daffern Hong, Sierra Madre, CA (US)

( * ) Notice: Subject to any disclaimer, the term of this patent is extended or adjusted under 35 U.S.C. 154(b) by 0 days.

(21) Appl. No.: 17/145,886

(22) Filed: Jan. 11, 2021

(65) Prior Publication Data

US 2021/0218408 A1 Jul. 15, 2021

Related U.S. Application Data

(60) Provisional application No. 62/959,303, filed on Jan. 10, 2020.

(51) Int. Cl.
| | |
|---|---|
| *H03L 7/24* | (2006.01) |
| *H03K 3/03* | (2006.01) |
| *H03B 5/12* | (2006.01) |
| *H03L 7/183* | (2006.01) |

(52) U.S. Cl.
CPC ............ *H03L 7/24* (2013.01); *H03B 5/1228* (2013.01); *H03K 3/0322* (2013.01); *H03L 7/183* (2013.01)

(58) Field of Classification Search
CPC ........ H03B 5/1228; H03L 7/183; H03L 7/24; H03K 3/0322

USPC ............ 331/57, 47, 48, 51, 45, 55; 377/118
See application file for complete search history.

(56) References Cited

U.S. PATENT DOCUMENTS 9,008,261 B2 * 4/2015 Xiu ...................... H03K 23/667
377/47

OTHER PUBLICATIONS

B. Razavi, K. F. Lee, and R. H. Yan, "Design of high-speed, low-power frequency dividers and phase-locked loops in deep submicron CMOS," IEEE Journal of Solid-State Circuits, vol. 30, No. 2, pp. 101-109, Feb. 1995. doi: 10.1109/4.341736.
A. Li, S. Zheng, J. Yin, X. Luo, and H. C. Luong, "A 21-48 GHz subhar-monic injection-locked fractional-N frequency synthesizer for multiband point-to-point backhaul communications," IEEE Journal of Solid-State Circuits, vol. 49, No. 8, pp. 1785-1799, Aug. 2014. doi: 10.1109/JSSC. 2014.2320952.
M. Ferriss, B. Sadhu, A. Rylyakov, H. Ainspan, and D. Friedman, "A 13.1-to-28GHz fractional-N PLL in 32nm SOI CMOS with a ΔΣ noise- cancellation scheme," in 2015 IEEE International Solid-State Circuits Conference (ISSCC) Digest of Technical Papers, Feb. 2015, pp. 192-193. doi: 10.1109/ISSCC.2015.7062991.

(Continued)

Primary Examiner — Arnold M Kinkead
(74) Attorney, Agent, or Firm — Perkins Coie LLP

(57) ABSTRACT

The present disclosure includes a frequency divider circuit that includes a superharmonically injection-locked ring oscillator, injection circuitry, and various switches. The input can include a collection of signal components at different phases that are all at the same, but changeable, frequency. The divider's division ratio can be changed during the divider's operation by, for example, utilizing one or more switches to change: the number of stages in the ring oscillator, and/or which stage(s) of the ring oscillator are injected into by which input signal components.

24 Claims, 14 Drawing Sheets

(56) References Cited

OTHER PUBLICATIONS

A. Hussein, S. Vasadi, M. Soliman, and J. Paramesh, "A 50-to-66GHz 65nm CMOS all-digital fractional-N PLL with 220fsrms jitter," in 2017 IEEE International Solid-State Circuits Conference (ISSCC) Digest of Technical Papers, Feb. 2017, pp. 326-327. doi: 10.1109/ISSCC.2017. 7870393.

H. Yoon, J. Kim, S. Park, Y. Lim, Y. Lee, J. Bang, K. Lim, and J. Choi, "A-31dBc integrated-phase-noise 29GHz fractional-N frequency synthesizer supporting multiple frequency bands for backward-compatible 5G using a frequency doubler and injection-locked frequency multipliers," in 2018 IEEE International Solid-State Circuits Conference (ISSCC) Digest of Technical Papers, Feb. 2018, pp. 366-367. doi: 10.1109/ISSCC.2018.8310336.

B. Razavi, RF Microelectronics, 2nd ed. Prentice Hall, 2011.

T. A. D. Riley, M. A. Copeland, and T. A. Kwasniewski, "Delta-sigma modulation in fractional-N frequency synthesis," IEEE Journal of Solid-State Circuits, vol. 28, No. 5, pp. 553-559, May 1993. doi: 10.1109/4.229400.

M. Acar, D. Leenaerts, and B. Nauta, "A wide-band CMOS injection-locked frequency divider," in 2004 IEEE Radio Frequency Integrated Circuits (RFIC) Symposium Digest of Papers, Jun. 2004, pp. 211-214. doi: 10.1109/RFIC.2004.1320574.

M. V. Krishna, A. Jain, N. A. Quadir, P. D. Townsend, and P. Ossieur, "A 1V 2mW 17GHz multi-modulus frequency divider based on TSPC logic using 65nm CMOS," in Proceedings of the 40th European Solid State Circuits Conference (ESSCIRC 2014), Sep. 2014, pp. 431-434. doi: 10.1109/ESSCIRC.2014.6942114.

H. Wu and A. Hajimiri, "A 19GHz 0.5mW 0.35µm CMOS frequency divider with shunt-peaking locking-range enhancement," in 2001 IEEE International Solid-State Circuits Conference (ISSCC) Digest of Technical Papers, Feb. 2001, pp. 412-413. doi: 10.1109/ISSCC . 2001 .912698.

M. Tiebout, "A CMOS direct injection-locked oscillator topology as high-frequency low-power frequency divider," IEEE Journal of Solid-State Circuits, vol. 39, No. 7, pp. 1170-1174, Jul. 2004. doi: 10.1109/JSSC.2004.829937.

C.-C. Chen, H.-W. Tsao, and H. Wang, "Design and analysis of CMOS frequency dividers with wide input locking ranges," IEEE Transactions on Microwave Theory and Techniques, vol. 57, No. 12, pp. 3060-3069, Dec. 2009. doi: 10.1109/TMTT.2009.2033239.

L. Romano, S. Levantino, C. Samori, and A. L. Lacaita, "Multiphase LC oscillators," IEEE Transactions on Circuits and Systems I: Regular Papers, vol. 53, No. 7, pp. 1579-1588, Jul. 2006. doi: 10.1109/TCSI. 2006.876415.

B. D. Hong, "Periodically disturbed oscillators," Dept. of Electrical Engineering, PhD thesis, California Institute of Technology, Jul. 2018.

J.-C. Chien and L.-H. Lu, "Analysis and design of wideband injection-locked ring oscillators with multiple-input injection," IEEE Journal of Solid-State Circuits, vol. 42, No. 9, pp. 1906-1915, Sep. 2007. doi: 10.1109/JSSC.2007.903058.

Y.-L. Yeh and H.-Y. Chang, "Design and analysis of a W-band divide-by-three injection-locked frequency divider using second harmonic en-hancement technique," IEEE Transactions on Microwave Theory and Techniques, vol. 60, No. 6, pp. 1617-1625, Jun. 2012. doi: 10.1109/TMTT.2012.2189244.

W. Zhu, H. Yang, T. Gao, F. Liu, T. Yin, D. Zhang, and H. Zhang, "A 5.8-GHz wideband TSPC divide-by-16/17 dual modulus prescaler," IEEE Transactions on Very Large Scale Integration (VLSI) Systems, vol. 23, No. 1, p. 194-197, Jan. 2015. doi: 10.1109/TVLSI. 2014. 2300871.

B. Hanafi and K. Sharaf, "7.5-GHz injection-locked dual modulus prescaler with 1-GHz locking range," in Proceedings of the 19th International Conference on Microelectronics, Dec. 2007, pp. 307-310.

X. Yu, J. Zhou, X. Yan, W. M. Lim, M. A. Do, and K. S. Yeo, "Sub-mW multi-GHz CMOS dual-modulus prescalers based on programmable injection-locked frequency dividers," in Proceedings of the 2008 IEEE Radio Frequency Integrated Circuits Symposium, Jun. 2008, pp. 431-434.

A. Mirzaei, M. E. Heidari, R. Bagheri, and A. A. Abidi, "Multiphase injection widens lock range of ring-oscillator-based frequency dividers," IEEE Journal of Solid-State Circuits, vol. 43, No. 3, pp. 656-671, Mar. 2008.

\* cited by examiner

204

5 Stages for Division-by-2

| Stage $k$ | Ideal Injected Phase $\phi(k)$ | Closest Quadrature Injection |
|---|---|---|
| 0 | 0 (reference) | IP (0) |
| 1 | $8\pi/5 = 1.6\pi$ | QN ($1.5\pi$) |
| 2 | $6\pi/5 = 1.2\pi$ | IN ($\pi$) |
| 3 | $4\pi/5 = 0.8\pi$ | IN ($\pi$) (not chosen) |
| 4 | $2\pi/5 = 0.4\pi$ | QP ($0.5\pi$) |

7 Stages for Division-by-3

| Stage $k$ | Ideal Injected Phase $\phi(k)$ | Closest Quadrature Injection |
|---|---|---|
| 0 | 0 (reference) | IP (0) |
| 1 | $4\pi/7 \approx 0.57\pi$ | QP ($0.5\pi$) |
| 2 | $8\pi/7 \approx 1.14\pi$ | IN ($\pi$) |
| 3 | $12\pi/7 \approx 1.71\pi$ | Don't Care |
| 4 | $2\pi/7 \approx 0.29\pi$ | |
| 5 | $6\pi/7 \approx 0.86\pi$ | IN ($\pi$) (not chosen) |
| 6 | $10\pi/7 \approx 1.43\pi$ | QN ($1.5\pi$) |

| Division Ratio $N$ | Number of Stages $K$ |
|---|---|
| 2 | 5 |
| 3 | 7 |
| 4 | 9 |
| 5 | 11 |
| 7 | 15 |
| 11 | 23 |
| 13 | 27 |
| 16 | 33 |

| Stage $k$ | Ideal Injected Phase $\phi(k)$ | Closest Quadrature Injection |
|---|---|---|
| 0 | 0 (reference) | IP (0) |
| 1 | $(1 + 1/K) \times 0.5\pi$ if $N$ is odd<br>$(3 + 1/K) \times 0.5\pi$ if $N$ is even | QP ($0.5\pi$) if $N$ is odd<br>QN ($1.5\pi$) if $N$ is even |
| 2 | $(1 + 1/K) \times \pi$ | IN ($\pi$) |
| ... | ... | Don't Care |
| $K - 1$ | $(3 - 1/K) \times 0.5\pi$ if $N$ is odd<br>$(1 - 1/K) \times 0.5\pi$ if $N$ is even | QN ($1.5\pi$) if $N$ is odd<br>QP ($0.5\pi$) if $N$ is even |

| Division Ratio $N$ | Number of Stages $K$ |
|---|---|
| 2 | 4 |
| 3 | 6 |
| 4 | 8 |
| 5 | 10 |

| Stage $k$ | Ideal Injected Phase $\phi(k)$ | Closest Quadrature Injection |
|---|---|---|
| 0 | 0 (reference) | IP (0) |
| 1 | $1.5\pi$ | QN ($1.5\pi$) |
| 2 | $\pi$ | IN ($\pi$) |
| 3 | $0.5\pi$ | QP ($0.5\pi$) |

MULTIPLE-MODULI RING-OSCILLATOR-BASED FREQUENCY DIVIDER

CROSS REFERENCE TO RELATED APPLICATION

This application claims the benefit of U.S. Provisional Patent Application No. 62/959,303, filed Jan. 10, 2020, titled "Multiple-Moduli Ring-Oscillator-Based Frequency Divider," the disclosure of which is incorporated herein by reference in its entirety.

GOVERNMENT LICENSE RIGHTS

Some embodiments of the invention were made with government support under Grant No. FA9550-16-1-0566 awarded by the U.S. Air Force. The government may have certain rights in the invention.

TECHNICAL FIELD

This invention relates generally to electronic circuit design, and more specifically, to electronic frequency dividers with dynamically adjustable division ratios.

BACKGROUND

Modern frequency synthesizers see an ever increasing demand for higher operation frequency and lower power consumption. For example, implementations based on phase-locked loops (PLLs) typically generate the output frequency from a stable, low-frequency reference such as a crystal. Therefore, in the loop's feedback path, the output frequency of the voltage-controlled oscillator (VCO) needs to be divided down to the input frequency provided by the reference. This necessitates the use of a frequency divider. Frequency dividers may generate lower-frequency output signals from higher-frequency input signals, where the output frequency is equal to the input frequency divided by a positive integer, known as the division ratio or the modulus. An injection-locked frequency divider may be constructed from a tuned oscillator that is injection locked to a higher-frequency input signal over a range of input frequencies.

While the overall division ratio may need to be in the thousands or millions for output frequencies in the gigahertz and terahertz ranges, it is typically the "first few" divisions—the initial reduction of $f_{out}$ to $f_{out}/P$ where P=2, 3, or 4, for example—that experience the sharpest trade-off between speed and power and are therefore the most challenging to realize, as compared to subsequent reductions. Further, to enable the synthesis of multiple output frequencies from the same reference, another design consideration for the frequency divider is the configurability of different division ratios. Overall, frequency dividers suitable for use as a prescaler in the feedback path of a phase-locked loop (PLL)-based frequency synthesizer entail a number of design challenges, including low power consumption and the availability of multiple moduli that can be dynamically switched among during the divider's operation.

BRIEF DESCRIPTION OF THE DRAWINGS

One or more embodiments of the present disclosure are illustrated by way of example and not limitation in the figures of the accompanying drawings, in which like references indicate similar elements. These drawings are not necessarily drawn to scale.

FIG. 2B is a table showing an example of how to choose the stages that are to be injected into by the (e.g., quadrature) injections for the 1:2 division ratio.

FIG. 2C is a table showing an example of how to choose the stages that are to be injected into by the (e.g., quadrature) injections for the 1:3 division ratio.

FIG. 5D is a table showing an example relationship between the number of stages and the division ratio of the circuit of FIG. 5A.

FIG. 5E is a table showing an example of how to choose the stages that are to be injected into by the (e.g., quadrature) injections for all eight division ratios described with respect to the example circuit in FIG. 5A.

FIG. 6B is a table showing an example relationship between the number of stages and the division ratio of the circuit of FIG. 6A.

FIG. 6C is a table showing an example of how to choose the stages that are to be injected into by the (e.g., quadrature) injections for all four division ratios described with respect to the example circuit in FIG. 6A.

DETAILED DESCRIPTION

Figure 1:
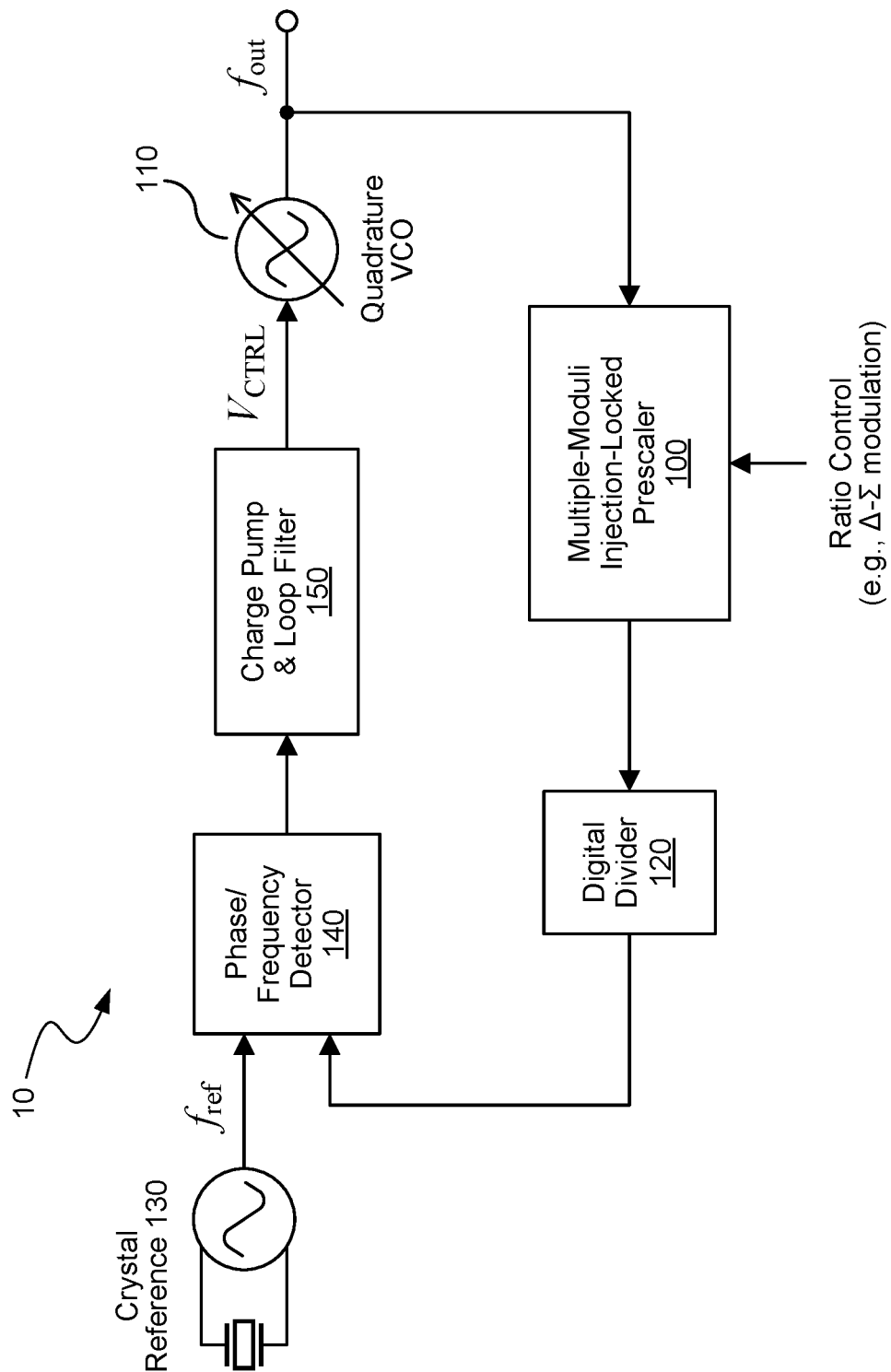
FIG. 1 is a block diagram of an example phase-locked loop-based frequency synthesizer that embodies one or more techniques disclosed here, where the synthesizer includes an injection-locked multiple-moduli prescaler as the first frequency divider in the feedback path.

Frequency dividers with multiple, dynamically programmable division ratios find applications in various areas of electronics. One application is the implementation of fractional-N phase-locked loops for high-frequency synthesis. More specifically, there are many types of frequency dividers. An injection-locked frequency divider may operate as a tuned oscillator that is injection locked to an input clock frequency divided by a positive integer N, known as the division ratio or modulus. An injection-locked frequency divider may operate over a range of input clock frequencies, known as the frequency divider's lock range.

As discussed above, design footprint, power consumption, and the number of division ratios are an area where compromises are traditionally made in frequency synthesizer designs, and where improvements are desirable. It is recognized in the present disclosure as advantageous to have a prescaler design that can exhibit both low power consumption and the ability to divide by multiple moduli, and in the meantime with a design footprint that is as small as possible.

However, conventional injection-locked frequency dividers typically face a number of issues when used as a prescaler. For one, they typically only have a limited range of operable frequencies, and it may be technically difficult to enhance their lock range. Further, conventional non-digital, oscillator-based prescalers are mostly designed to have only a single division ratio. Moreover, division by an even ratio is often accomplished through injection into the tail of an inductor-capacitor (LC) oscillator, the inductor in which requires a large amount of chip area, which can increase the fabrication cost of the circuit and overall design difficulty, especially when the circuit needs to be integrated with other circuits. With the above in mind, when it comes to a prescaler design, conventionally there exists a tradeoff in choosing between power-hungry digital dividers and potentially bulky injection-locked dividers with a fixed division ratio and a limited operating range.

Accordingly, introduced here are techniques for implementing a multiple-moduli prescaler from an injection-locked ring-oscillator-based divider. Among other benefits, the disclosed prescaler circuit can enable a circuit design (e.g., a PLL) that has dynamically changeable division ratios, reduced power consumption (e.g., as compared to conventional digital designs, especially when the division ratio is low, such as 2, 3, or 4), and a small footprint (e.g., as compared to other types of design, such as those that have inductor-capacitor (LC) oscillators). The present disclosure enables ways for alleviating this tradeoff by, in some embodiments, providing a methodology for designing multiple-moduli prescalers based on injection-locked ring oscillators. It is noted by the present disclosure that ring oscillators can be small and compact as compared to other oscillators (e.g., LC oscillators), can operate at high speeds with reasonable power consumption, and can be amenable to lock-range enhancement through a variety of techniques discussed here. Further, as discussed in more detail below, the disclosed techniques can be similarly applicable to create a circuit with any arbitrary number of integer-valued moduli; these techniques are not limited to those specific examples that are disclosed here.

In the following, numerous specific details are set forth to provide a thorough understanding of the presently disclosed techniques. In other embodiments, the techniques introduced here can be practiced without these specific details. In other instances, well-known features, such as specific fabrication techniques, are not described in detail in order to avoid unnecessarily obscuring the present disclosure. References in this description to "an embodiment," "one embodiment," or the like, mean that a particular feature, structure, material, or characteristic being described is included in at least one embodiment of the present disclosure. Thus, the appearances of such phrases in this specification do not necessarily all refer to the same embodiment. On the other hand, such references are not necessarily mutually exclusive either. Furthermore, the particular features, structures, materials, or characteristics can be combined in any suitable manner in one or more embodiments. Also, it is to be understood that the various embodiments shown in the figures are merely illustrative representations and are not necessarily drawn to scale.

Several details describing structures or processes that are well-known and often associated with frequency synthesizers, PLLs, and corresponding subcomponents, but that can unnecessarily obscure some significant aspects of the disclosed techniques, are not set forth in the following description for purposes of clarity. Moreover, although the following disclosure sets forth several embodiments of different aspects of the present disclosure, several other embodiments can have different configurations or different components than those described in this section. Accordingly, the introduced techniques can have other embodiments with additional elements or without several of the elements described below.

The terms "coupled" and "connected," along with their derivatives, can be used herein to describe structural relationships between components. It should be understood that these terms are not intended as synonyms for each other. Rather, in particular embodiments, "connected" can be used to indicate that two or more elements are in direct contact with each other. Unless otherwise made apparent in the context, the term "coupled" can be used to indicate that two or more elements are in either direct or indirect (with other intervening elements between them) contact with each other, or that the two or more elements co-operate or interact with each other (e.g., as in a cause and effect relationship), or both.

Overview

FIG. 1 is a block diagram of an example phase-locked loop-based frequency synthesizer 10. The synthesizer 10 includes an injection-locked multiple-moduli prescaler 100 as the first frequency divider in the feedback path. The synthesizer 10 further includes a voltage-controlled oscillator (VCO) 110, a digital divider 120, a crystal reference 130, and a phase/frequency detector 140.

As shown in FIG. 1, the low-frequency (e.g., in the range of kilohertz to hundreds of megahertz) crystal reference oscillator 130, which can oscillate at a reference frequency $f_{ref}$, is used to synthesize an output frequency $f_{out}$. Depending on the field application, the output frequency $f_{out}$ can be thousands to millions of times larger than the reference frequency $f_{ref}$. Generally speaking, the loop operates by correcting phase errors between (1) the reference signal generated by the crystal reference 130 and (2) a frequency-divided version of the output signal generated by the voltage-controlled oscillator (VCO) 110. The loop's forward path therefore uses the phase/frequency detector 140 to detect this phase error. The output of the phase/frequency detector 140 is received by a charge pump/loop filter block 150, which is operable to produce a control voltage $V_{CTRL}$. The control voltage $V_{CTRL}$ is in turn used to control and tune the VCO 110 in the loop. For purposes of simplicity in discussion, the embodiments described in the present disclosure have a quadrature VCO (i.e., one that is capable of generating four oscillation signals at quadrature phases). Quadrature VCOs are particularly useful in radio-frequency communication systems due to the usefulness of quadrature signals in such systems (e.g., because of their use in I/Q modulation and image rejection). However, it is noted that the presently disclosed techniques are similarly applicable for those VCOs which generate less phases or more phases, and with any (including non-uniform) distribution of phases.

In accordance with the present embodiments, the frequency synthesizer's loop has a feedback path that divides the output frequency $f_{out}$ down to the reference frequency $f_{ref}$. This frequency division can be performed by the digital divider 120. However, conventional digital dividers (e.g., the digital divider 120) often cannot handle frequencies as high as that required by modern frequency-synthesis applications, or they consume unacceptably large amounts of power if operated at those frequencies. As such, the frequency synthesizer 10 includes another frequency divider in addition to the digital divider 120. This additional frequency divider, depicted in FIG. 1 as the prescaler 100, can be implemented using an injection-locked oscillator. The prescaler 100 can be positioned between the output frequency $f_{out}$ and the digital divider 120. The purpose of this additional frequency divider (e.g., the prescaler 100) is to "prescale" the output frequency $f_{out}$ down to a frequency that can be feasibly handled (e.g., in terms of power consumption and/or thermal budget of the circuit) by the digital divider 120. That is to again say, while the overall division ratio between $f_{out}$ and $f_{ref}$ needs to be in the thousands to millions, it is the "first few" divisions—the initial reduction of $f_{out}$ to $f_{out}/2, f_{out}/3$, or $f_{out}/4$, for example—that experience the sharpest tradeoff between speed and power. The frequency divider 100 thus functions as a "prescaler" that handles these first few division ratios.

And yet, a conventional prescaler may only feature a fixed division ratio N, where N is a positive integer. With a prescaler having a fixed division ratio of N, the tuning resolution of the frequency synthesizer is reduced by a factor of N. For example, with such a prescaler, changing the division ratio of the digital divider 120 from M to (M+1), where M is a positive integer, necessarily changes the output frequency $f_{out}$ from $N \times M \times f_{ref}$ to $N \times (M+1) \times f_{ref}$. The two frequencies differ from each other by $N \times f_{ref}$ instead of the reference frequency $f_{ref}$ (i.e., the original tuning resolution in the absence of the conventional, fixed division ratio prescaler).

Thus, one conventional attempt to mitigate this problem is by having a prescaler design that features multiple division ratios (or moduli) which, in some designs, may be dynamically switched between during the operation of the frequency synthesizer. Take, for example, a typical dual-modulus prescaler, which may feature two division ratios: N and (N+1). Assume again that the digital divider 120 has a division ratio M If the dual-modulus prescaler spends (P/M) of the time at N and the remaining (1−P/M) of the time at (N+1), where P is an integer between 0 and M, then the output frequency $f_{out}$ becomes $(NM+P) \times f_{ref}$ on average. This technique is typically known as fractional-N frequency synthesis. By incrementing or decrementing P, the output frequency $f_{out}$ changes by $\pm f_{ref}$, indicating a tuning resolution equal to the reference frequency $f_{ref}$. Notably, there are also a number of known techniques for modulating the division ratio; one example is "delta-sigma" modulation, which has gained popularity due to its capability for generally reducing quantization noise and unwanted spurs in the output spectrum of the frequency synthesizer.

It is therefore desirable for the prescaler to exhibit both low power consumption and the ability to divide by multiple moduli, and yet as discussed above, conventional injection-locked frequency dividers, when used as a prescaler, often suffer from issues like limited operating ranges, inability to enhance the lock range, lack of availability in oscillator-based prescaler designs, and so on. In recognition of this, the present disclosure includes techniques and a number of example designs that realize a multiple-moduli prescaler from an injection-locked ring-oscillator-based divider.

Changing the Division Ratio

An oscillator is a circuit that is capable of generating a periodic output signal on its own; the frequency of this signal is known as the oscillator's free-running frequency. However, when an external periodic signal is injected into the oscillator (whose frequency is called the injection frequency), the oscillator is also capable of synchronizing to this external input signal (or to a frequency-divided version thereof), provided that the injection frequency is sufficiently close to (e.g., depending on the injection strength and type of oscillator, within a range as narrow as 10% or as wide as 25% on either side of) the oscillator's free-running frequency (or an integer multiple thereof). The range of frequencies over which this described synchronization can occur is known as the lock range. In the case where the injection frequency is an integer multiple of the frequency of the injection-locked oscillator's output, the oscillator functions as an injection-locked frequency divider.

A ring oscillator includes a plurality of delay stages connected in series to form a closed ring. For the purposes of this disclosure, the stages are enumerated in the following manner: An arbitrarily chosen stage is designated the reference stage and is labeled as k=0; the other stages are then enumerated in the order in which they are connected in the ring, from k=1 to k=(K−1), where K is the total number of stages. Injection into a ring oscillator can be achieved by injecting into the input node of a particular stage of the ring oscillator. In this disclosure, injecting "into a stage" is synonymous with injecting at the input node of that stage. Also, in this disclosure, except where otherwise made apparent by the context, the oscillation voltage "associated with" a stage means the oscillation voltage at the input node of that stage.

In one or more embodiments, an input available for injection into the prescaler includes multiple input signal components at different phases. In the example frequency synthesizer 10 of FIG. 1, the phase-locked loop's VCO 110 is a quadrature VCO that includes four input signal components, 90° phase apart from one another, available for injection into the prescaler 100. Note again, that although the embodiments disclosed here are described as having quadrature input signal components, the techniques disclosed in the present disclosure is similarly applicable to any suitable number of input signal components with any suitable collection of phases.

In order to change the division ratio N of the prescaler (from, say, $N_1$ to $N_2$), two example steps can be taken: (a) tune the ring oscillator's free-running frequency; and (b) switch the stages that receive the input signal components.

(a) Tuning the Ring Oscillator's Free-Running Frequency

First, the free-running frequency of the ring oscillator can be tuned such that two ranges including, (1) the range of input frequencies for which division by $N_1$ is possible and (2) the range of input frequencies for which division by $N_2$ is possible, have range overlap. In some embodiments, the oscillator is so tuned that the two ranges have as much the overlap as possible. Put another way, in these embodiments, the overlap between the lock ranges at different division ratios (with respect to the input frequency, not to the oscillator's output frequency) is maximized. Because the center of the lock range (with respect to the input frequency) is roughly given by the oscillator's free-running frequency multiplied by the division ratio, in these embodiments, the oscillator's free-running frequencies for the division ratios $N_1$ and $N_2$ (denoted as $f_1$ and $f_2$ respectively) should, at least ideally, satisfy the equation: $f_1 \times N_1 = f_2 \times N_2$.

Furthermore, it is noted that a ring oscillator's free-running frequency may be roughly inversely proportional to the number of stages in the ring. Therefore, one way to tune the free-running frequency can be changing the number of stages; the number of stages can be increased by "switching in" additional stages, whereas the number of stages can be decreased by "switching out" existing stages. If the total number of stages when the division ratio is $N_1$ (or $N_2$) is denoted as $K_1$ (or $K_2$), then the inverse proportionality between $f_1$ and $K_1$ as well as between $f_2$ and $K_2$ means that $K_1$ and $K_2$ should, at least ideally, satisfy the equation: $K_1/N_1 = K_2/N_2$. Therefore, for example, the number of stages can be doubled to double the division ratio.

Note that, at least in a number of embodiments, the single-ended inverter-chain ring oscillator includes an odd number of stages. In these embodiments with odd number staged oscillators, the equation above, $K_1/N_1 = K_2/N_2$, may still function as an approximate guide. In practice, circuit simulations can be performed to optimize the number of stages such that the relation $f_1 \times N_1 = f_2 \times N_2$ can be held as closely as practical.

(b) Switching the Stages that Receive the Input Signal Components

To enable effective division by a modulus N, the phase differences between different input signal components should, at least ideally, be equal to N times the phase differences between the oscillation voltages associated with the respective stages that those input signal components are injected into. Recall that the oscillation voltage associated with a stage is defined as the oscillation voltage at the input node of that stage. Therefore, an equivalent formulation of this condition is that the phase differences between different input signal components should, at least ideally, be N times the phase differences between the oscillation voltages at the respective nodes that those input signal components are injected into. Consequently, generally speaking, when N changes, so does the stage that should receive a particular input signal component.

Figure 9A:
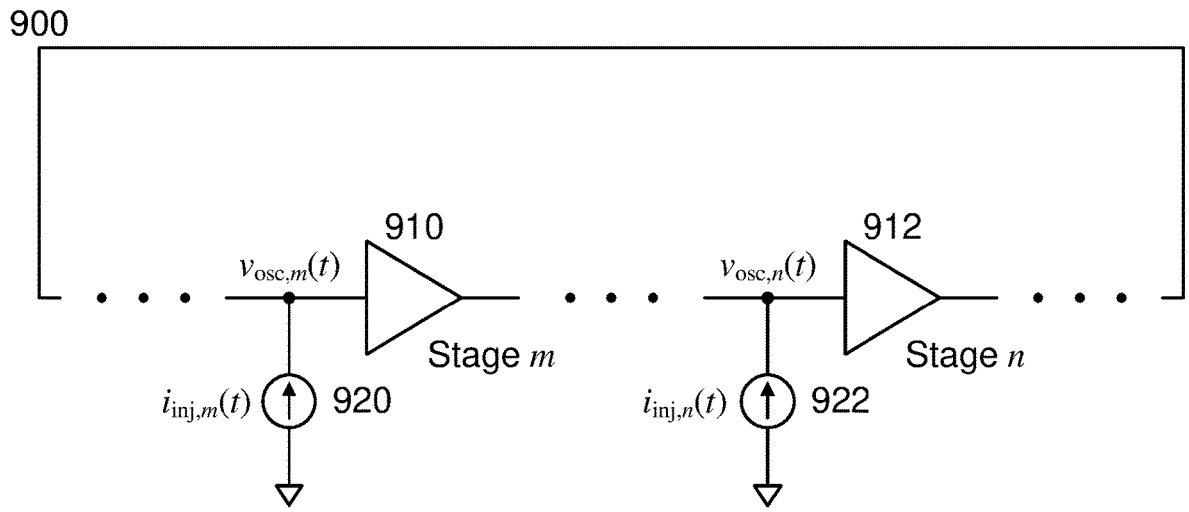
FIG. 9A is a circuit schematic of two example stages of a ring oscillator and their corresponding injections.
Figure 9B:
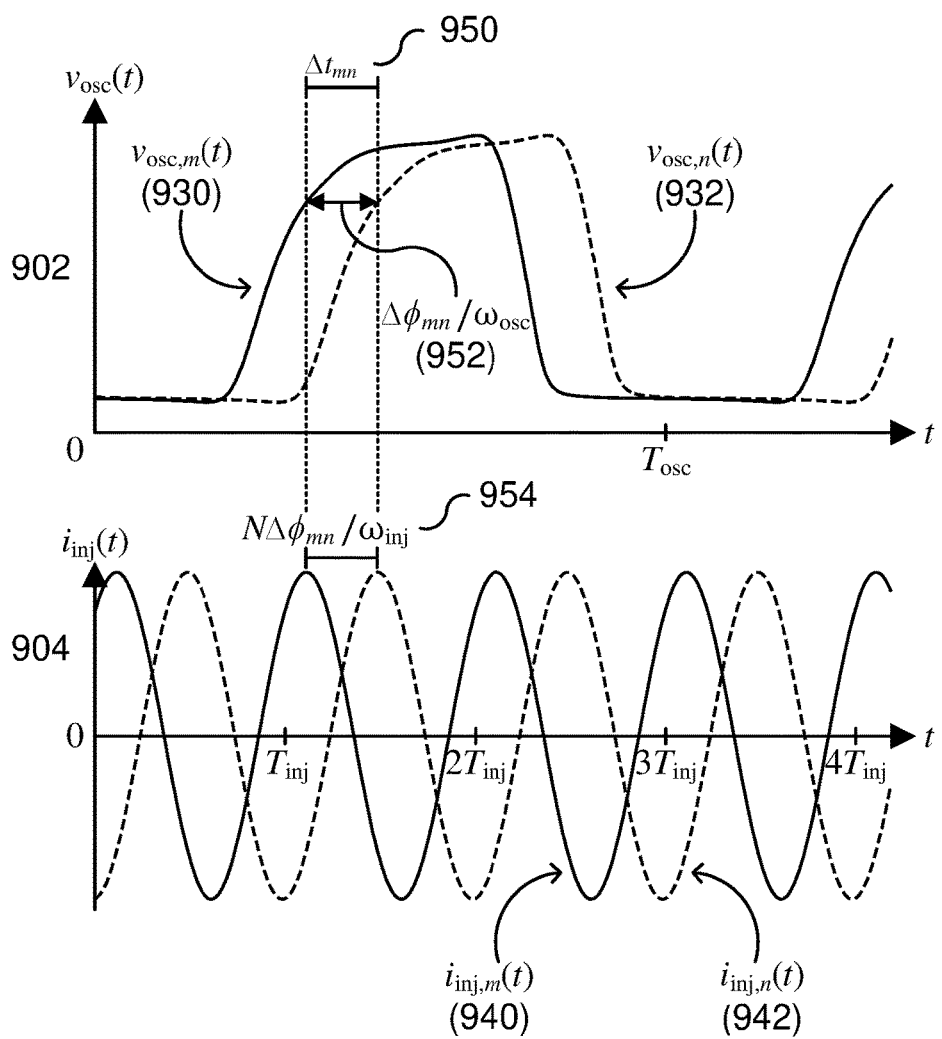
FIG. 9B shows the time-domain waveforms of the oscillation voltages and the ideal injection currents for the example stages shown in FIG. 9A.

FIG. 9A shows a circuit schematic 900 of two example stages of a ring oscillator and their corresponding injections. The two stages are labeled "Stage m" (910) and "Stage n" (912), and they are injected into by injection currents 920 and 922, respectively. FIG. 9B shows a first chart 902 that illustrates the time-domain waveforms of the oscillation voltages associated with these two stages 910 and 912. Also shown in FIG. 9B is a second chart 904 that illustrates the time-domain waveforms of the input signal components generated by the two injection currents 920 and 922. Assuming the oscillator is locked, the frequency of the latter (i.e., the injection frequency $\omega_{inj} = 2\pi/T_{inj}$) is exactly N times the frequency of the former (i.e., the oscillation frequency $\omega_{osc} = 2\pi/T_{osc}$). FIG. 9B also shows the ideal phase difference between the input signal components injected into two stages of the ring oscillator of FIG. 9A.

The fundamental idea illustrated here is that injections into different stages should ideally be separated by the same time difference that separates the oscillation voltages associated with those stages. Here, the time difference $\Delta t_{mn}$ (950) can be written as $\Delta \phi_{mn}/\omega_{osc}$ (952), indicating a phase difference of $\Delta \phi_{mn}$ between the two stages' oscillation voltages, $v_{osc,m}(t)$ (930) and $v_{osc,n}(t)$ (932). Alternatively, the same time difference $\Delta t_{mn}$ (950) can also be written as $N\Delta \phi_{mn}/\omega_{inj}$ (954) because $\omega_{inj} = N\omega_{osc}$, indicating a phase difference of $N \times \Delta \phi_{mn}$ between the two stages' input signal components, $i_{inj,m}(t)$ (940) and $i_{inj,n}(t)$ (942). In light of the desired parity in the time difference between the oscillation voltages and the input signal components, the ideal phase difference, which is implemented in a variety of embodiments disclosed here, follows from this relationship: The same time difference at the Nth harmonic corresponds to N times the phase shift. For this example depicted in FIGS. 9A and 9B, N=3 and $\Delta \phi_{mn} = 45°$.

In the case of a single-ended inverter-chain ring oscillator with K total stages, the phase difference between adjacent stages is given by $(\pi - \pi/K)$ radians. Therefore, the phase difference between a reference stage (i.e., stage 0) and another stage that is k stages away from the reference stage (i.e., stage k) is given by $k \times (\pi - \pi/K)$ radians. This indicates that the ideal phase for an input signal component injected into stage k is $N \times k \times (\pi - \pi/K)$ radians for a division ratio of N. If this phase exceeds $2\pi$ radians, the remainder after its division by $2\pi$ (i.e., $[N \times k \times (\pi - \pi/K)] \bmod 2\pi$ radians) can be taken, because phase is invariant to shifts by $2\pi$ radians.

In the case of a differential ring oscillator with K total stages, the phase difference between adjacent stages is given by $-\pi/K$ radians. Therefore, the phase difference between a reference stage (i.e., stage 0) and another stage that is k stages away from the reference stage (i.e., stage k) is given by $-k \times \pi/K$ radians. Likewise, this indicates that the ideal phase for an input signal component injected into stage k is $-N \times k \times \pi/K$ radians for a division ratio of N. Again, this phase is mathematically equivalent to $(-N \times k \times \pi/K) \bmod 2\pi$ radians. Note that these two types of ring oscillators are described here only for illustrative purposes; the disclosed techniques can be applicable to another suitable ring oscillator type or topology in a similar manner.

After these ideal phases are calculated, the closest matches between the ideal phases and the available phases of the input signal components can be determined. Note that, according to the present embodiments, one of the input signal components (a "reference" input signal component) should always be injected into one of the stages (a "reference" stage) during the circuit's normal operation, and both the reference input signal component and the reference stage can be chosen arbitrarily.

An example process for handling the remaining input signal components (and the remaining stages) is provided as follows. Because there may be more stages than there are input signal components, if such is the case, the example process can include determining, for each input signal component, the stage whose ideal phase most closely matches the input signal component's phase, and in such case, the remaining stages which are not matched to an input signal component are left alone and not injected into the oscillator. If, on the other hand, there are more input signal components than the number of stages, then the example procedure can include determining, for each stage, the input signal component whose phase most closely matches the stage's ideal phase. Then, the remaining input signal components that are not matched to a stage are left alone and not used to inject into the oscillator.

During normal operation, because of the dynamic changeability in the division ratio of the disclosed circuits, in addition to discrete (integer) division ratios, fractional ratios in between discrete ratios can further be realized by dithering the integer division ratios that can be achieved (e.g., using pulse-width modulation or delta-sigma modulation techniques). In this way, the fractional-N frequency synthesizers disclosed here are able to synthesize frequencies that are in between integer multiples of the PLL's reference frequency. Note that delta-sigma modulation, as compared to pulse-width modulation, generally tends to introduce less spurs into the output spectrum. The prescaler/divider disclosed here can be particularly useful in generating fractional ratios, at least because of the dynamic programmability of the division ratio (as discussed in further detail below). Accordingly, at least some embodiments of the present disclosure can be configured (e.g., through performing delta-sigma modulation in the division ratio control of the disclosed prescaler) to select an effective frequency division ratio by using a combination of the available frequency division ratios implemented in the frequency divider.

With the above description in mind, several example embodiments are discussed in greater detail below.

Inverter-Chain Ring Oscillator with Two Moduli

Figure 2A:
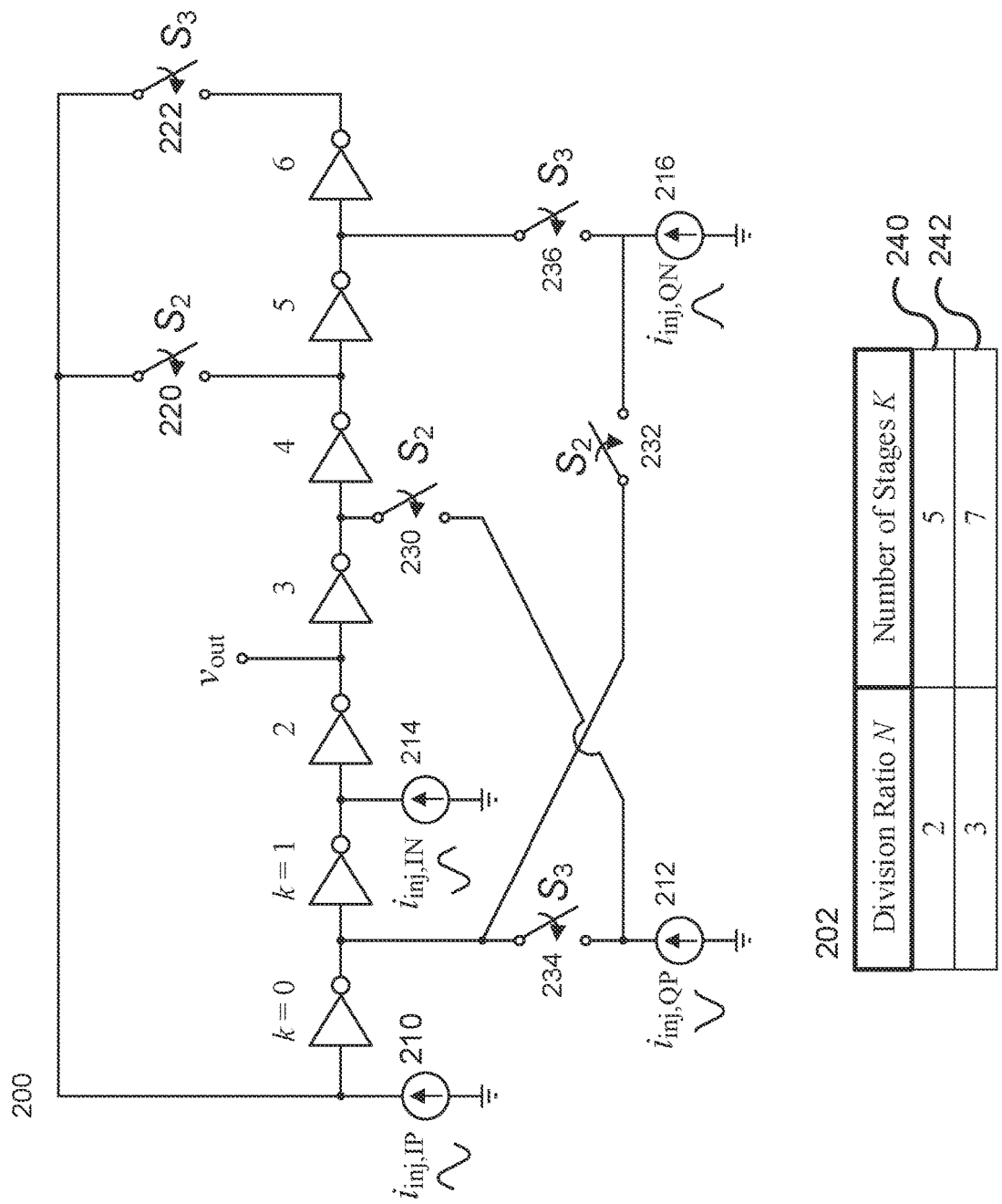
FIG. 2A is a circuit schematic of an example injection-locked dual-modulus prescaler implemented using a single-ended inverter-chain ring oscillator capable of dividing by 1:2 and 1:3.

FIG. 2A shows one embodiment, implemented using a single-ended inverter-chain ring oscillator 200, that is capable of dividing by two division ratios: 1:2 and 1:3. Table 202 shows the example relationship between the number of stages and the division ratio. A switch $S_N$ closes (i.e., is electrically conducting) if and only if the chosen division ratio is N. For example, switch $S_2$ closes if and only if the chosen division ratio is 2, and switch $S_3$ closes if and only if the chosen division ratio is 3. In this manner, switches 220 and 222 can control whether the oscillator has five or seven stages, respectively, which in turn and in accordance with entries 240 and 242, control the division ratio of the ring oscillator 200. Also shown in FIG. 2A are four quadrature injection inputs, injections IP, IN, QP, and QN. Like discussed before, these inputs represent the input frequency but with a 90 degree phase shift from each other.

With continued reference to FIG. 2A, in FIGS. 2B and 2C, tables 204 and 206 show, for the example circuit in FIG. 2A, how to choose which quadrature injections are to be injected into the inputs of which stages for the 1:2 and 1:3 division ratios, respectively (in accordance with the example procedure detailed above). Injection IP (210) is chosen as the reference and always gets injected into stage 0, as reflected by entries 250 and 260. When the division ratio is 1:2, entries 252, 254, and 256 indicate respectively that injection QN (216) should pass through switch 232 and be injected into stage 1; injection IN (214) should be injected into stage 2, and injection QP (212) should pass through switch 230 and be injected into stage 4. When the division ratio is 1:3, entries 262, 264, and 266 indicate respectively that injection QP (212) should pass through switch 234 and be injected into stage 1, injection IN (214) should again be injected into stage 2, and injection QN (216) should pass through switch 236 and be injected into stage 6.

Note that entries 258 and 268 indicate that the second-to-last stage can also be chosen for the injection IN (214), because the ideal injected phase is as close to π as it is for stage 2 for both ratios. However, note that this choice necessitates switching between injecting into stage 3 when the division ratio is 1:2 and injecting into stage 5 when the division ratio is 1:3. It may be therefore, depending on the actual application, more convenient to choose to inject IN (214) into stage 2 for both ratios (entries 254 and 264). Another consideration should be taken, that is, more switches generally means more loading of the oscillator and the injection circuitry, which can degrade the circuit's performance. Lastly, once all of the available injections have been assigned stages to inject into, the ideal injected phases for the remaining stages become no longer relevant, as shown by the "Don't Care" value for entry 269.

Figure 3:
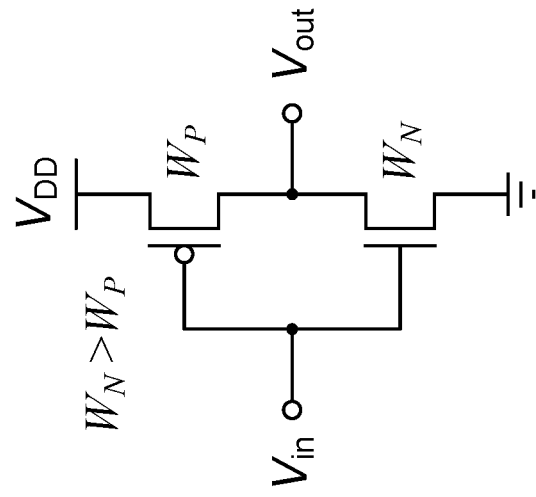
FIG. 3 is a circuit schematic of an example implementation of an inverter that can be used to implement the example ring oscillator of FIG. 2A.
Figure 3:
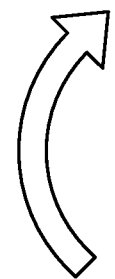
Figure 3:
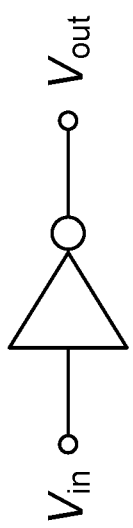

FIG. 3 shows how a single inverter (or delay stage) 300 of the ring oscillator 200 of FIG. 2A may be implemented in some embodiments. In typical inverters used in complementary metal-oxide-semiconductor (CMOS) logic, the P-type field effect transistor (PFET) is made larger than the N-type FET (NFET) (e.g., with twice the total gate width) because electron holes have a lower mobility than electrons. This typical design is to ensure parity between the rise/fall times of the inverter.

However, according to one or more embodiments disclosed here (e.g., in the example of FIG. 3), a CMOS inverter 302 can feature an NFET with a larger gate area than the PFET (i.e., $W_N > W_P$), so as to make the rise and fall times of the oscillation waveform uneven (by exacerbating the inverter's inherent asymmetry due to the electron's higher mobility). This can be done to widen the lock range when dividing by an even ratio, as division by an even ratio requires the presence of even harmonics in the oscillation waveform, and a perfectly symmetric oscillation waveform with equal rise and fall times contains only odd harmonics. This technique can preserve the ring oscillator's ability to divide by an odd ratio.

Figure 4:
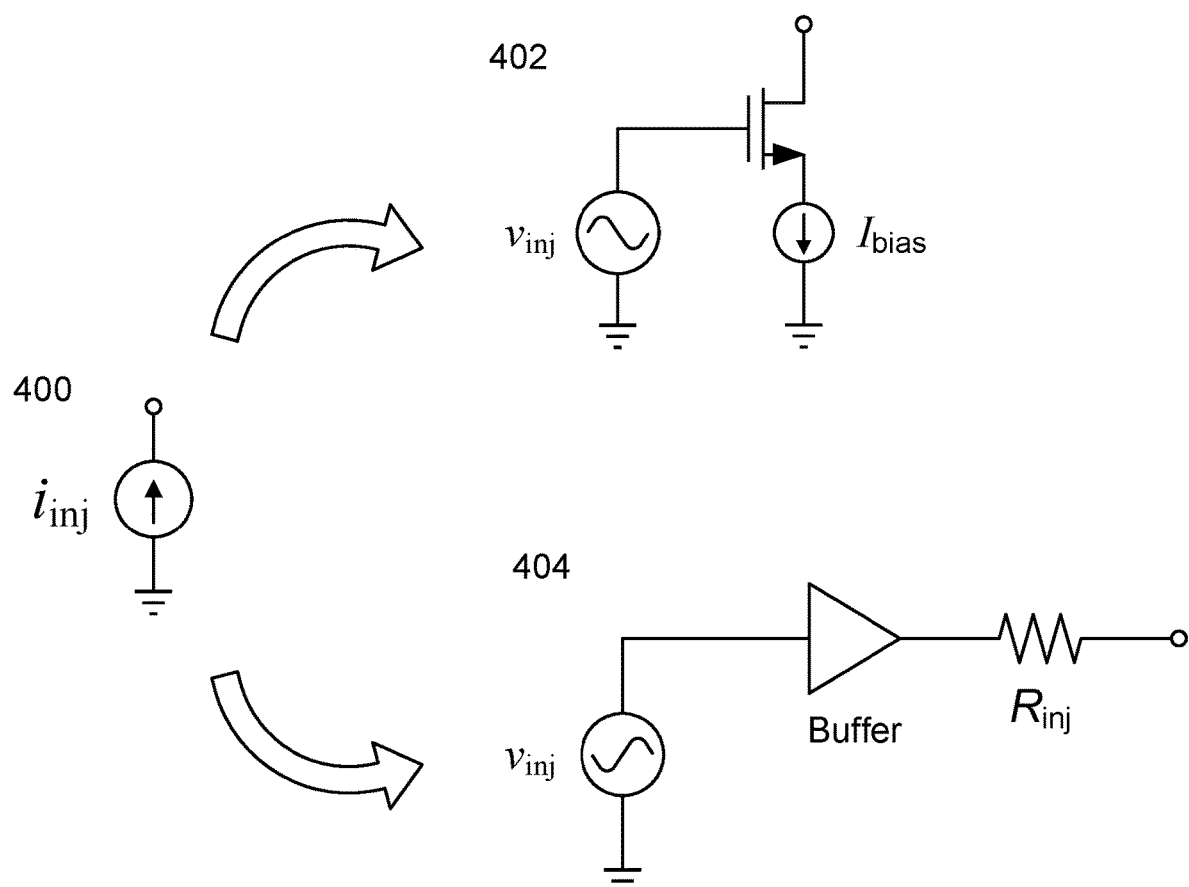
FIG. 4 shows circuit schematics of two example implementations of the injection current source that can be used to inject into the example ring oscillator of FIG. 2A.

FIG. 4 shows two example implementations of an injection current source 400 from an injection voltage: (1) in one embodiment, as an N-type MOS (NMOS) transistor current source 402 (whose amplitude is controlled by a direct-current (DC) current source $I_{bias}$), or (2) in another embodiment, as circuit 404, with the buffered injection voltage driving a series resistor $R_{inj}$ (the Norton equivalent of which is a current source in parallel with said resistor). These example injection current sources can be used to inject into the example ring oscillator of FIG. 2A. It is noted that these example designs are for purposes of explaining the disclosed techniques; other implementations may be suitable for different applications and/or under different design settings.

Inverter-Chain Ring Oscillator with Eight Moduli

Figure 5A:
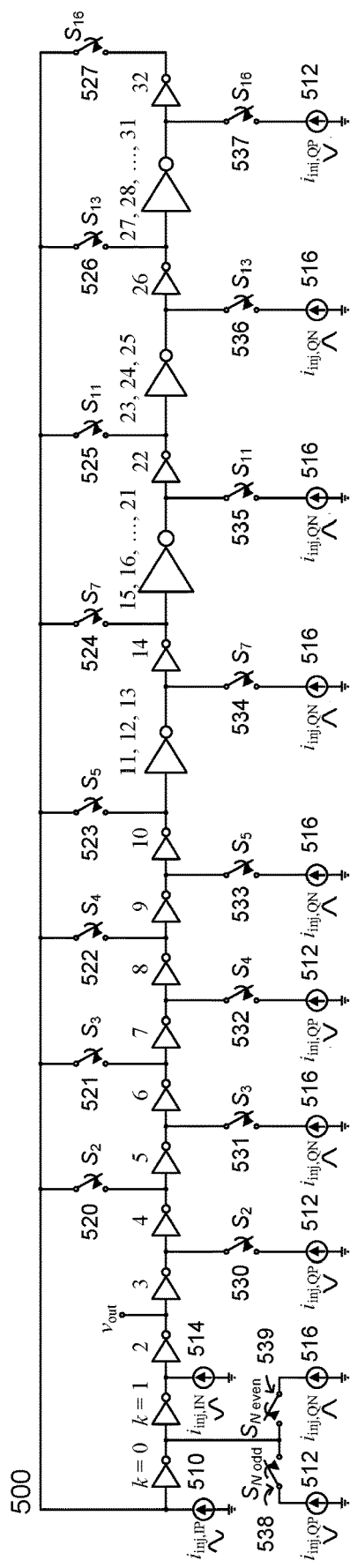
FIG. 5A is a circuit schematic of an example injection-locked multiple-moduli prescaler implemented using a single-ended inverter-chain ring oscillator capable of dividing by eight ratios: 1:2, 1:3, 1:4, 1:5, 1:7, 1:11, 1:13, and 1:16.

FIG. 5A shows another embodiment, implemented using a single-ended inverter-chain ring oscillator 500, that is capable of dividing by eight ratios. Specifically, the example injection-locked multiple-moduli prescaler implemented using a single-ended inverter-chain ring oscillator is capable of dividing by ratios including: 1:2, 1:3, 1:4, 1:5, 1:7, 1:11, 1:13, and 1:16.

Figure 5B:
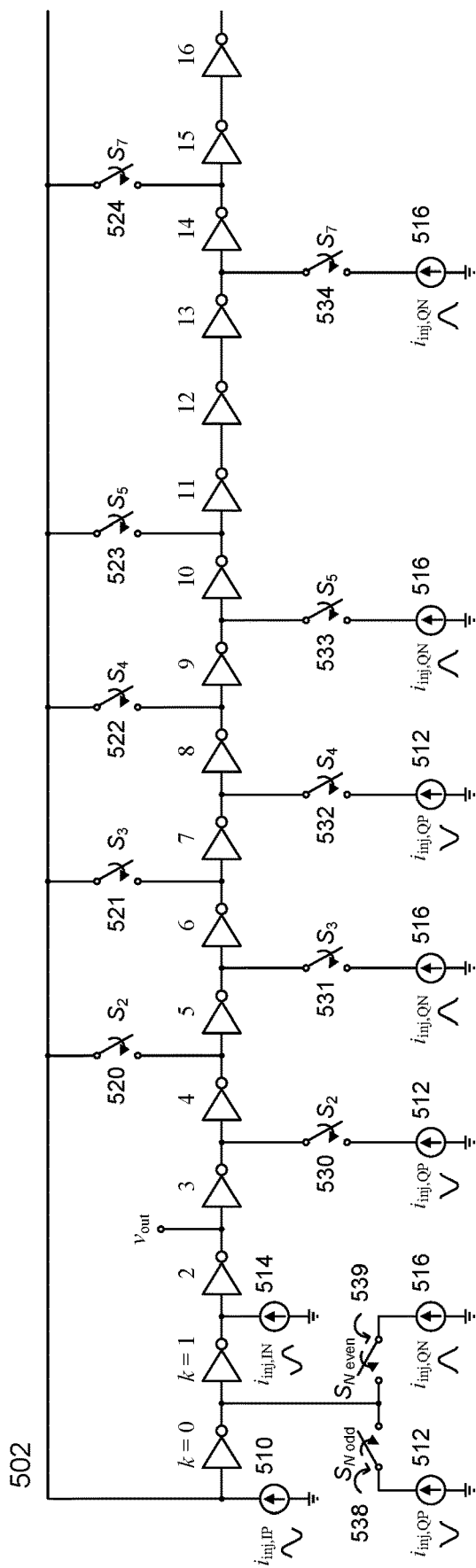
FIG. 5B and FIG. 5C respectively show a left and a right partial view of the example circuit of FIG. 5A in more detail.
Figure 5C:
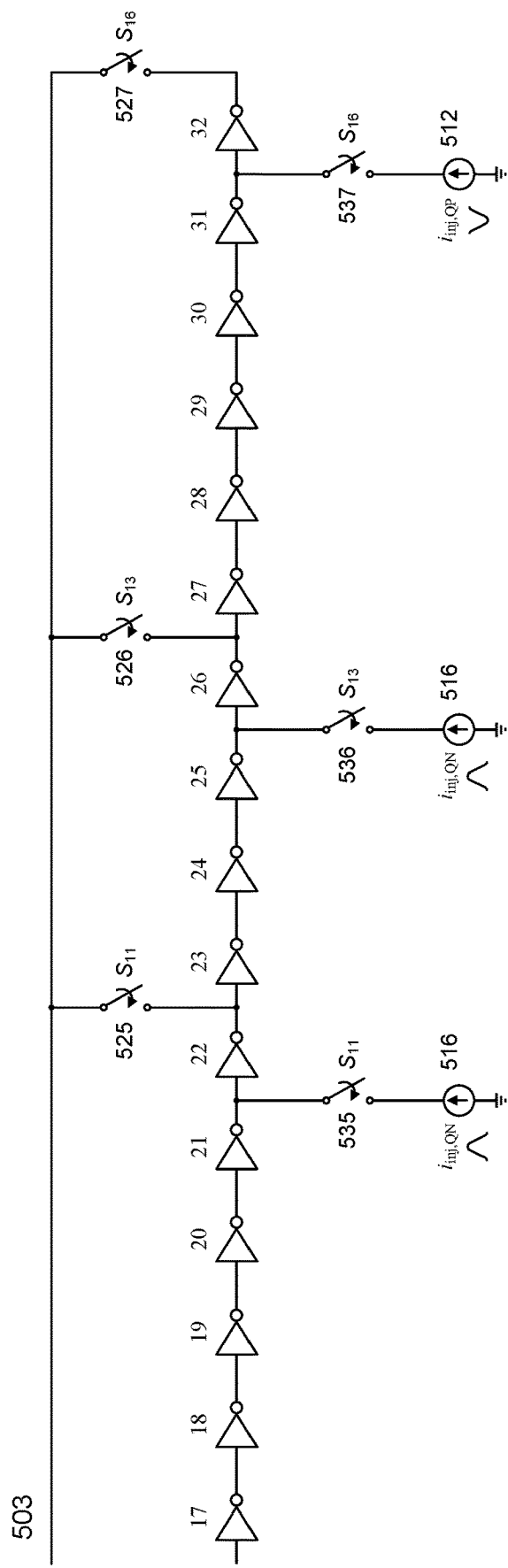

FIGS. 5B and 5C are each a partial view that together form a single, complete figure. The circuit in FIGS. 5B and 5C, formed by connecting 502 and 503, is therefore an example implementation of the circuit in FIG. 5A. Note that the larger inverters in FIG. 5A represent multiple smaller inverters connected in series (as indicated by the plurality of stage numbers above them) and are shown as a single block for convenience; the details of these inverters can be seen more clearly in FIGS. 5B and 5C, with simultaneous reference to FIG. 5A. Similar to the connotation discussed above, a switch $S_N$ is to close if and only if the chosen division ratio is N. Additionally, the switches $S_{N\,odd}$ and $S_{N\,even}$ are to close if and only if the chosen division ratio is odd or even, respectively.

FIG. 5D is a table 504 that shows an example relationship between the number of stages and the division ratio of the circuit of FIG. 5A. In accordance with entries 540-547, switches 520-527 can control whether the oscillator has five, seven, nine, eleven, fifteen, twenty-three, twenty-seven, or thirty-three stages, respectively. Each number of stages has a corresponding division ratio.

FIG. 5E is a table 506 that shows an example of how to choose which quadrature injections are to be injected into the inputs of which stages, described with respect to the example circuit in FIG. 5A. Table 506 is applicable for all of the division ratios shown in table 504 (and, more generally, for this type of oscillator when the number of stages K is one more than twice the division ratio N).

With simultaneous reference to FIGS. 5B and 5C, injection IP (510) is chosen as the reference and always gets injected into stage 0, as reflected by entry 550. Entry 554 indicates that, regardless of the division ratio, injection IN (514) should be injected into stage 2.

If the division ratio is odd, then entry 552 indicates that injection QP (512) should pass through switch 538 and be injected into stage 1. On the other hand, entry 556 indicates that injection QN (516) should be injected into the very last stage (K−1), thereby passing through switch 531 for a 1:3 division ratio, switch 533 for a 1:5 division ratio, switch 534 for a 1:7 division ratio, switch 535 for a 1:11 division ratio, or switch 536 for a 1:13 division ratio.

However, if the division ratio is even, then entry 552 indicates that injection QN (516) should pass through switch 539 and be injected into stage 1. On the other hand, entry 556 indicates that injection QP (512) should be injected into the very last stage (K−1), thereby passing through switch 530 for a 1:2 division ratio, switch 532 for a 1:4 division ratio, or switch 537 for a 1:16 division ratio.

In this manner, similar to the example of FIG. 2, once all four of the available quadrature injections have been assigned stages to inject into, the ideal injected phases for the remaining stages become no longer relevant, as indicated by the "Don't Care" value in entry 558. Example implementations of the inverters and injection current sources are provided in FIG. 3 and FIG. 4, respectively.

Differential Ring Oscillator with Four Moduli

Figure 6A:
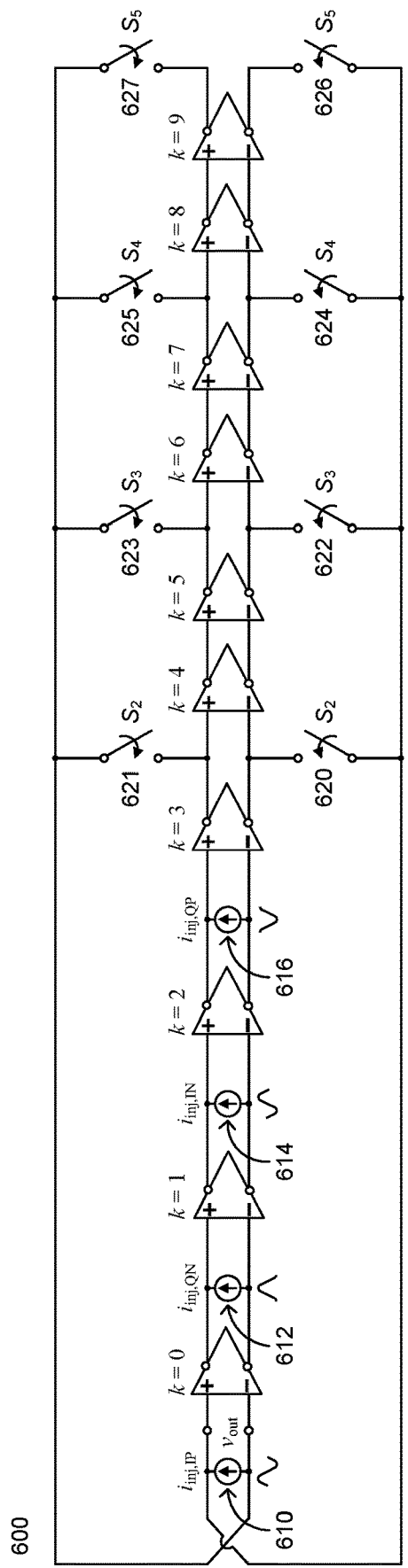
FIG. 6A is a circuit schematic of an example injection-locked multiple-moduli prescaler implemented using a differential ring oscillator capable of dividing by four ratios: 1:2, 1:3, 1:4, and 1:5.

FIG. 6A shows yet another embodiment, implemented using a differential ring oscillator 600, that is capable of dividing by four ratios. More specifically, FIG. 6A is an example injection-locked multiple-moduli prescaler implemented using a differential ring oscillator capable of dividing by ratios including: 1:2, 1:3, 1:4, and 1:5. Similar to the connotation used above, a switch $S_N$ is to close if and only if the chosen division ratio is N.

FIG. 6B is a table 602 that provides an example relationship between the number of stages and the division ratio, for the ring oscillator 600 in the circuit of FIG. 6A. In accordance with entry 630, switches 620 and 621 can cause the oscillator 600 to have four stages. In accordance with entry 632, switches 622 and 623 can cause the oscillator 600 to have six stages. In accordance with entry 634, switches 624 and 625 can cause the oscillator 600 to have eight stages. In accordance with entry 636, switches 626 and 627 can cause the oscillator 600 to have ten stages. Table 602 also shows the division ratio that corresponds to each of said number of stages.

FIG. 6C is a table 604 that shows an example of how to choose which quadrature injections are to be injected into the inputs of which stages for the example circuit in FIG. 6A. Table 604 is applicable for all of the division ratios shown in table 602 (and, more generally, for this type of oscillator when the number of stages K is double the division ratio N). Injection IP (610) is chosen as the reference and always gets injected into stage 0, as reflected by entry 640. Entry 642 indicates that, regardless of the division ratio, injection QN (612) should be injected into stage 1. Entry 644 indicates that, regardless of the division ratio, injection IN (614) should be injected into stage 2. Entry 646 indicates that, regardless of the division ratio, injection QP (616) should be injected into stage 3. Rows for the rest of the stages are not shown because, similar to the examples of FIGS. 2 and 5, those rows are not relevant because all four available injections have already been assigned stages to inject into. Note that, in this particular example, no switches are needed to change the stage that a particular injection gets injected into when the division ratio changes.

Figure 7:
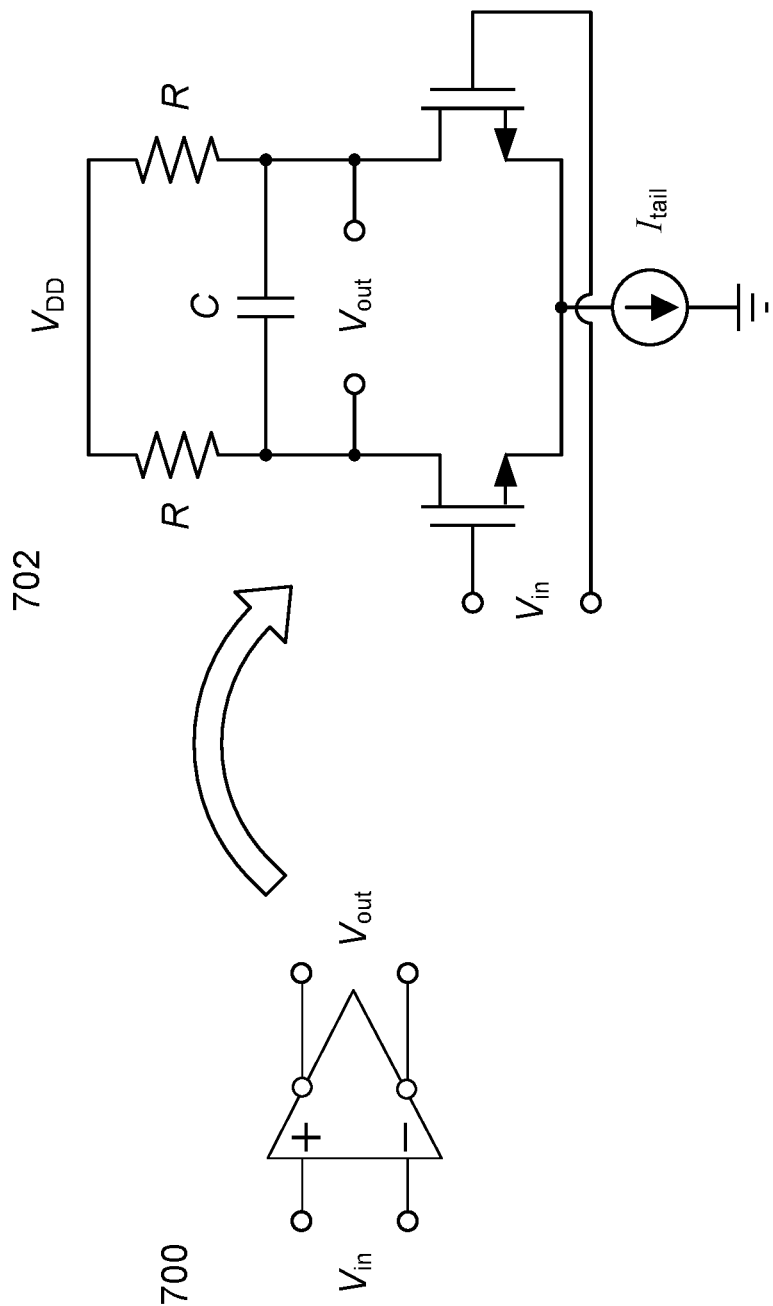
FIG. 7 is a circuit schematic of an example implementation of a delay stage that can be used to implement the ring oscillator of FIG. 6A.

FIG. 7 shows how a single delay stage (e.g., delay stage 700) of the ring oscillator 600 of FIG. 6A may be implemented in one embodiment: as a differential amplifier 702 with a differential capacitive load C. Note that the time constant between R and C can be used to control the delay and thereby tune the free-running frequency of the oscillator.

Figure 8:
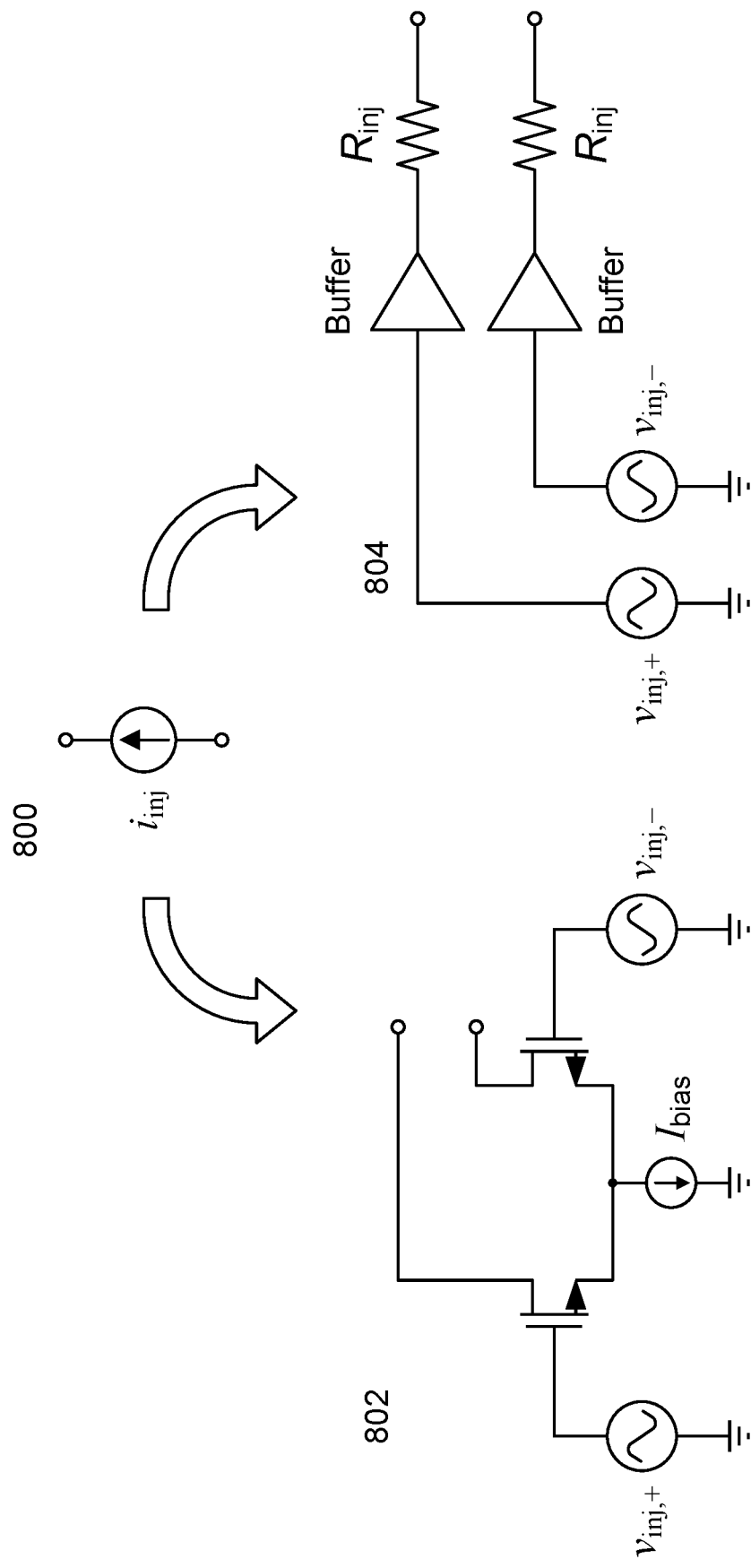
FIG. 8 shows circuit schematics of two example implementations of the differential injection current source that can be used to inject into the differential ring oscillator of FIG. 6A.

FIG. 8 shows two example implementations of a differential injection current source 800 from a differential injection voltage: (1) in one embodiment, as an NMOS differential pair 802 (whose amplitude is controlled by a DC tail current source $I_{bias}$), or (2) in another embodiment, as circuit 804, with the buffered injection voltages driving series resistors (the Norton equivalent of each is a current source in parallel with the resistor). These two example implementations of the differential injection current source can be used to inject into the differential ring oscillator of FIG. 6A. It is again noted that these example designs are for purposes of explaining the disclosed techniques; other implementations may be suitable for different applications and/or under different design settings.

Overall, the disclosed frequency dividers can generate lower-frequency signals from higher-frequency signals, with the latter's frequency being an integer multiple of the former's frequency (without taking into account known modulation/dithering techniques, e.g., pulse swallowing, random jittering, delta-sigma modulation). The frequency dividers disclosed here can dynamically change their division ratio N during the divider's operation. This can be achieved by: (a) changing the number of stages in the ring oscillator, by switching in additional stages or switching out existent stages, in such a way that the ring oscillator's free-running frequency nears that of the input frequency divided by N; and (b) changing which stages are injected into by which input signal components, in such a way that the relative phase differences between different input signal components is N times the phase differences between the oscillation voltages associated with the respective stages that those components are injected into. As discussed above, both of these changes can be realized through a network of electronic switches.

Note that, for (b) and for those embodiments where the phase difference between two stages multiplied by N is a multiple of 360 degrees, it is desirable that the stages' input nodes in these embodiments are not to be shorted together even though they can accept injections from input signal components of the same phase. Instead, according to one or more embodiments, the same input phase can be generated by replicating that input signal component using a buffer.

The purpose of (a), changing the number of stages, is to maximize the overlap between the ring oscillator's lock ranges (with respect to the input frequency) at different division ratios. The underlying physical reasoning is that the lock range is roughly centered around the ring oscillator's free-running oscillation frequency multiplied by N, and this free-running frequency is roughly inversely proportional to the number of stages.

The purpose of (b), ensuring that the relative phase differences between different input signal components is N times the phase differences between the respective stages that those components are injected into, is to maximize the divider's lock range at the division ratio N. The underlying mathematical reasoning is that the same time difference corresponds to N times the phase difference at N times the frequency.

As a practical matter, the number of input signal components M is often 2, for differential inputs, or 4, for quadrature inputs. In general, however, M can be any positive integer, and the input signal components' phases need not be distributed uniformly.

It is noted that, while there may be existing dual-modulus prescalers based on injection-locked inverter-chain ring oscillators, various embodiments discussed in the present disclosure may be distinguishable from them in at least the aspect that the disclosed embodiments can utilize multiple input signal components at different phases. Further, conventional prescalers do not change the ring oscillator's total number of stages when switching the division ratio, and their injections are typically directed to an inverter's "tail" (e.g., in series between the NFET's source and ground), as opposed to a parallel injection of current into a stage's input node such as one or more embodiments described above. While tail injections are often utilized in the superharmonic locking of LC oscillators, modulating the tail/bias currents of an inverter-chain ring oscillator's stages can be a less effective means of injection locking the oscillator compared with injecting into the stages' input nodes (e.g., as in one or more embodiments described above). Also, to achieve frequency division, existing designs often entail injecting the same signal into the tails of multiple stages, which does not account for the phase delay between stages and can therefore result in unstable and unpredictable oscillation modes. At least for these reasons, conventional ring-oscillator-based dual-modulus prescalers that are designed with these existing techniques do not perform as reliably and satisfactorily as the disclosed embodiments, especially for frequency synthesizer applications.

Conclusion

The above embodiments of the present disclosure are illustrative and not limitative. Embodiments of the present invention are not limited by the number of division ratios, the values of the division ratios, the frequency of operation, the number of input signal components, the phases of the input signal components, the type or topology of the ring oscillator, and the implementation of the injection and switching circuitry. Embodiments of the present disclosure are not limited by the type of substrate in which various electrical components of the circuit are formed. Other additions, subtractions, or modifications are obvious in view of the present disclosure and are intended to fall within the scope of the appended claims.

While particular embodiments have been shown and described, it will be obvious to those skilled in the art that changes and modifications may be made without departing from this disclosure in its broader aspects and, therefore, the appended claims are to encompass within their scope all such changes and modifications as fall within the true spirit and scope of this disclosure.

Further, it should be noted that the various circuits disclosed herein may be described using computer-aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL; formats supporting register-level description languages like RTL; formats supporting geometry description languages such as GDSII, GDSIII, GDSIV, CIF, MEBES; and any other suitable format or language. Computer-readable media in which such formatted data and/or instructions may be embodied include, but are not limited to, non-volatile storage media in various forms (e.g., optical, magnetic, or semiconductor storage media).

What is claimed is:

1. A ring oscillator based frequency divider circuit comprising:
    a frequency input that receives an input frequency;
    a control input that selects an effective frequency division ratio; and
    a frequency output that outputs, based on division using a ring oscillator that is capable of self-sustaining oscillation, a resulting frequency that equals the input frequency divided by the effective frequency division ratio, wherein a change in the effective frequency division ratio during operation of the frequency divider circuit results in a corresponding change in the resulting frequency.

2. The circuit of claim 1, wherein the ring oscillator is an injection locked type, and wherein the frequency input includes a plurality of input signal components, each input signal component representing a different phase of the input frequency.

3. The circuit of claim 2, further comprising:
    injection circuitry that is configured to inject one or more of the plurality of input signal components into the ring oscillator,
    wherein the control input is coupled to the injection circuitry to control a stage, in the ring oscillator, into which a particular input signal component injects.

4. The circuit of claim 3, wherein the stage into which the particular input signal component injects is controlled based on the effective frequency division ratio.

5. The circuit of claim 3, wherein the ring oscillator is a single-ended inverter type, and wherein controlling of which input signal component to inject and/or at what phase is controlled based on, for stage k:

$$\phi(k)=[kN(\pi-\pi/K)]\bmod 2\pi,$$

wherein k represents how many stages a given stage is away from a reference stage, wherein K is a total number of stages in the ring oscillator, and wherein N is the effective frequency division ratio.

6. The circuit of claim 3, wherein the ring oscillator is a differential type, and wherein controlling of which input signal component to inject and/or at what phase is controlled based on, for stage k:

$\phi(k)=(-kN\pi/K)\mod 2\pi,$ wherein k represents how many stages a given stage is away from a reference stage, wherein K is a total number of stages in the ring oscillator, and wherein N is the effective frequency division ratio.

7. The circuit of claim 1, wherein the control input selects the effective frequency division ratio based on controlling a number of active stages in the ring oscillator.

8. The circuit of claim 7, wherein the number of active stages selected by the control input results in a free-running oscillation frequency ($f_1$) of the ring oscillator for a first available frequency division ratio ($N_1$) being the closest, as compared to other possible numbers of active stages, to:

$f_2(N_2/N_1),$ wherein $f_2$ is a free-running oscillation frequency of the ring oscillator for a second available frequency division ratio, and wherein $N_2$ is a second available frequency division ratio.

9. The circuit of claim 7, wherein the control input, in selecting the effective frequency division ratio, further controls: (1) a particular input signal component, out of a plurality of input signal components representing different phases of the input frequency, to inject into the ring oscillator, and (2) which stage in the ring oscillator is to be injected with the particular input signal components.

10. The circuit of claim 1,
wherein the ring oscillator includes a number of stages,
wherein the control input further causes a phase difference between injections into two stages to be N times the phase difference between oscillation voltages associated with the two stages, and
wherein N is the effective frequency division ratio.

11. The circuit of claim 1,
wherein the effective frequency division ratio includes a plurality of integer ratios, each ratio having a corresponding lock range with respect to the input frequency, and
wherein a number of active stages is selected by the control input such that lock ranges of the plurality of integer ratios can overlap.

12. The circuit of claim 1, wherein the effective frequency division ratio is selected based on a combination of a plurality of available frequency division ratios.

13. The circuit of claim 12, wherein the plurality of available frequency division ratios include 1:2 and 1:3.

14. The circuit of claim 1, wherein the ring oscillator includes a single-ended inverter chain, wherein, in at least one inverter of the inverter chain, an N-type field effect transistor (FET) has a gate area that is larger than that of a P-type FET.

15. The circuit of claim 1, wherein the ring oscillator includes a single-ended inverter chain that has 7 stages, wherein the plurality of available frequency division ratios include 1:2 and 1:3, and wherein the frequency input includes 4 input signal components, each input signal component representing the input frequency but with a 90 degree phase shift.

16. The circuit of claim 15, wherein a number of active stages in the ring oscillator is 5 when the effective frequency division ratio is 1:2, and wherein the number of active stages in the ring oscillator is 7 when the effective frequency division ratio is 1:3.

17. The circuit of claim 15, wherein the frequency output is positioned between the third stage and the fourth stage, and wherein injection points in the ring oscillator for the input signal components include:
(1) a first injection point located at the input of the first stage; and
(2) a second injection point located between the second stage and the third stage.

18. The circuit of claim 17, wherein a first input signal component received at the first injection point and a second input signal component received at the second injection point have a 180 degree phase shift.

19. The circuit of claim 17, wherein the injection points in the ring oscillator for input signal components further include:
(3) a third injection point located between the first stage and the second stage;
(4) a fourth injection point located between the fourth stage and the fifth stage; and
(5) a fifth injection point located between the sixth stage and the seventh stage.

20. The circuit of claim 19, wherein the control input includes a switch operable to selectively inject either (a) a third input signal component at the fourth injection point and a fourth input signal component at the third injection point, or (b) the third input signal component at the third injection point and the fourth input signal component at the fifth injection point.

21. The circuit of claim 20, wherein the third input signal component and the fourth input signal component have a 180 degree phase shift.

22. The circuit of claim 1, wherein the frequency divider circuit does not include an inductor.

23. The circuit of claim 1, wherein the frequency output is coupled to a frequency input of another ring oscillator based frequency divider circuit.

24. The circuit of claim 1, being implemented as a prescaler of a phase-locked loop circuit, wherein the frequency output is coupled to a digital frequency divider.

* * * * *